(12) United States Patent
Shin

(10) Patent No.: US 6,211,744 B1
(45) Date of Patent: Apr. 3, 2001

(54) RING OSCILLATOR HAVING AN EXTERNALLY ADJUSTABLE VARIABLE FREQUENCY

(75) Inventor: Dong-Myeong Shin, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/302,077

(22) Filed: Apr. 28, 1999

(30) Foreign Application Priority Data

Apr. 28, 1998 (KR) .................................................. 98-15091

(51) Int. Cl.[7] ...................................................... H03B 5/24
(52) U.S. Cl. ............................ 331/57; 331/34; 331/177 R
(58) Field of Search ............................... 331/57, 111, 143, 331/177 R, 179, 34

(56) References Cited

U.S. PATENT DOCUMENTS

| | | | |
|---|---|---|---|
| 4,570,131 | * | 2/1986 | Lingstaedt .......................... 331/36 C |
| 4,723,114 | * | 2/1988 | D'Arrigo et al. ..................... 331/111 |
| 4,904,960 | * | 2/1990 | Izadinia et al. ....................... 331/111 |
| 5,036,300 | * | 7/1991 | Nicolai ................................. 331/143 |
| 5,153,534 | * | 10/1992 | Ruetz ................................... 331/111 |
| 5,175,512 | * | 12/1992 | Self ....................................... 331/57 |
| 5,508,664 | * | 4/1996 | Rizzo ................................... 331/111 |
| 5,710,527 | * | 1/1998 | Yaguchi et al. ........................ 331/57 |

* cited by examiner

*Primary Examiner*—David Mis
(74) *Attorney, Agent, or Firm*—Marger Johnson & McCollom, P.C.

(57) ABSTRACT

The present invention relates to a ring oscillator having a variable frequency allowing its use in a variety of application circuits. The ring oscillator produces an oscillating pulse signal having a frequency adjustable by an external input voltage. The ring oscillator includes an oscillating signal for generating an oscillating pulse signal, a frequency adjusting circuit, and an inverting circuit. The frequency adjusting circuit adjusts the frequency of the oscillating pulse signal responsive to the external input voltage, the external input voltage being different than a source voltage. The inverting circuit inverts the oscillating pulse signal.

21 Claims, 3 Drawing Sheets

RING OSCILLATOR HAVING AN EXTERNALLY ADJUSTABLE VARIABLE FREQUENCY

BACKGROUND OF THE INVENTION

1. Field of the Invention

The present invention relates to a ring oscillator and, more particularly, to a ring oscillator having a variable frequency.

2. Description of the Related Art

Ring oscillators are widely used in electronic equipment such as computers, televisions, videocassette recorders (VCRs) and the like. Typically, a ring oscillator comprises a series of discrete components including transistors, capacitors, etc. For a predetermined combination of discrete components, a conventional ring oscillator only produces a fixed frequency. That is, once assembled, the frequency of the oscillating signal generated by a ring oscillator cannot be externally adjusted. The result is that a conventional ring oscillator can only be used in a limited manner in electronic equipment.

Accordingly, a need remains for a ring oscillator having an externally adjustable variable frequency.

SUMMARY OF THE INVENTION

An object of the invention is to overcome problems associated with prior art ring oscillators.

Another object of the invention is to provide a ring oscillator having a variable frequency capable of use in different application circuits. The ring oscillator according to the present invention comprises an oscillating circuit for producing an oscillating pulse signal and a frequency adjusting circuit coupled to the oscillating circuit for varying a frequency of the oscillating pulse signal. The oscillating pulse signal includes a constant duty cycle.

The oscillating circuit comprises a current supply means for supplying a current and a charging/discharging means coupled to the current supply means for generating a first and a second node voltages by charging and discharging a first and second capacitors with the current responsive to an internal voltage. A switching means is coupled to the charging/discharging means for selectively providing either the first or a second node voltage as a switching means output signal responsive to a control signal. An inverting means including a first inverter for inverting the switching means output signal. The frequency adjusting circuit varies the frequency of the oscillating pulse signal by adjusting a charge/discharge time of the first capacitor.

The frequency adjusting circuit comprises a reference voltage means for supplying a reference voltage, a voltage comparator for comparing the reference voltage with an externally input voltage and adjusting the charge/discharge time of the first capacitor, and a current mirror coupled to the differential amplifier for adjusting a charge/discharge current. The frequency adjusting circuit may also comprise a current mirror having first and second NMOS transistors, a third NMOS transistor connected in parallel to the first NMOS transistor, and a first PMOS transistor coupled to the first NMOS transistor.

BRIEF DESCRIPTION OF THE DRAWINGS

The foregoing and other objects, features, and advantages of the present invention will become more readily apparent from the following detailed description of a preferred embodiment that proceeds with reference to the following drawings.

DETAILED DESCRIPTION OF THE PREFERRED EMBODIMENTS

Figure 1:
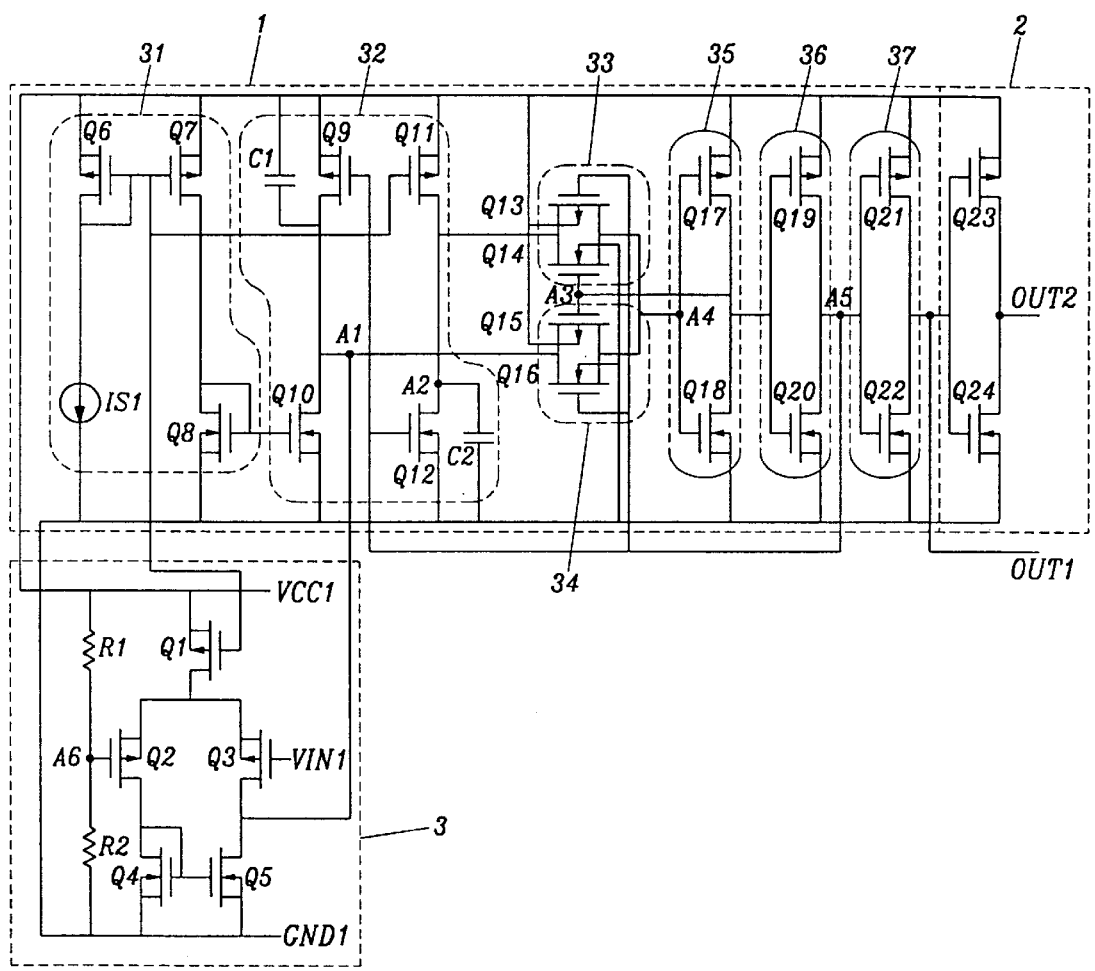
FIG. 1 is a circuit diagram of a ring oscillator having a variable frequency according to a first preferred embodiment of the present invention.

FIG. 1 is a circuit diagram of a ring oscillator having a variable frequency according to a first preferred embodiment of the present invention. Referring to FIG. 1, the ring oscillator having a variable frequency includes an oscillating circuit 1 for producing an oscillated pulse signal, a frequency adjusting circuit 3 for adjusting the frequency of the oscillating circuit 1 while maintaining constant the duty cycle of the oscillated pulse signal, and an inverting output circuit 2 for inverting the oscillated pulse signal output from the oscillating circuit 1.

The oscillating circuit 1 includes a current supply means 31, a charging/discharging means 32, a first switch 33, a second switch 34, a first inverter 35, a second inverter 36, and a third inverter 37. The current supply means 31 includes a current source IS1, P-type Metal Oxide Semiconductor (PMOS) transistors Q6 and Q7, and N-type Metal Oxide Semiconductor (NMOS) transistors Q8. The charging/discharging means 32 includes capacitors C1 and C2, PMOS transistors Q9 and Q11, and an NMOS transistor Q12. The first switch 33 includes a PMOS transistor Q13 and an NMOS transistor Q14. The second switch 34 includes a PMOS transistor Q15 and an NMOS transistor Q16. The first inverter 35 includes a PMOS transistor Q17 and an NMOS transistor Q18. The second inverter 36 includes a PMOS transistor Q19 and an NMOS transistor Q20. The third inverter 37 includes a PMOS transistor Q21 and an NMOS transistor Q22.

The frequency adjusting circuit 3 includes a resistor R1 connected to a supply voltage VCC1, a resistor R2 connected between the resistor R1 and a ground voltage GND1, and a PMOS transistor Q1 forming a current mirror with the PMOS transistor Q6 of the current supply means 31. A PMOS transistor Q2 has a source connected to a drain of the PMOS transistor Q1 and a gate connected to a node between the resistors R1 and R2. An NMOS transistor Q4 has a source and gate connected to a drain of the PMOS transistor Q2. A PMOS transistor Q3 has a source connected to a drain of the PMOS transistor Q1 and a gate provided with an external input voltage VIN1. A PMOS transistor Q5 has a drain connected to node A1 between the drains of PMOS transistors Q3 and Q9, a gate connected to a drain of the PMOS transistor Q2, and a source connected to a ground voltage GND1.

The inverting output circuit 2 includes a PMOS transistor Q23 having a gate connected to an output terminal OUT1 of the third inverter 37 and a source connected to the supply voltage VCC1. A NMOS transistor Q24 has a gate connected to the output terminal OUT1 of the third inverter 37, a drain connected to a drain of the PMOS transistor Q23, and a source connected to a ground voltage GND1.

The first embodiment of ring oscillator of the present invention operates as follows. When a supply voltage VCC1 is applied to the ring oscillator, the PMOS transistor Q6 turns on and the current source IS1 provides a current to the PMOS transistor Q7 and transistor Q11 that form a current mirror with the PMOS transistor Q6.

At the same time, the current flowing through the PMOS transistor Q7 turns on the NMOS transistor Q8. The NMOS transistor Q10, mirroring the current from the NMOS transistor Q8, turns on and a current flows through the transistor Q10. The PMOS transistor Q11 turns on and charges the capacitor C2. The charging time of the capacitor C2 depends on the amount of current flowing through PMOS transistor Q11 and the capacitance of the capacitor C2.

Initially, the voltage level of node A5 is in a low state. The charging voltage of the capacitor C2 is transmitted to node A4 of the first inverter 35 through the PMOS transistor Q13 of the first switch 33. As the voltage stored in the capacitor C2 increases, the voltage level of node A4 changes from a low to a high state. When the voltage of node A4 changes to a high state, node A3 of the first inverter 35 changes to a low state. If the voltage of node A3 changes to a low state, node A5 of the second inverter 36 changes to a high state and, simultaneously, the output voltage of the third inverter 37 becomes low.

If node A3 is in a low state, the NMOS transistor Q14 of the first switch 33 turns off and the PMOS transistor Q15 turns on. Furthermore, if node A3 is in a low state, node A5 is in a high state turning off the PMOS transistor Q13 of the first switch 33 and turning on the NMOS transistor Q16 of the second switch 34. Therefore, both the PMOS transistor Q13 and the NMOS transistor Q14 of the first switch 33 turn off and both the PMOS transistor Q15 and the NMOS transistor Q6 turn on.

If node A5 is in a high state, the PMOS transistor Q9 of the charging/discharging circuit 32 turns off and the NMOS transistor Q12 of the charging/discharging circuit 32 turns on charging the capacitor C1 and discharging the capacitor C2. The charging time of the capacitor C1 is determined by the amount of current flowing through the transistor Q10 and the capacitance of the capacitor C1. The discharging time of the capacitor C2 is determined by the amount of current flowing through the transistor Q12 and the capacitance of the capacitor C2.

When the second switch 34 turns on, the voltage of node A1 is transmitted to node A4 through the second switch 34. Therefore, if the PMOS transistor Q9 turns off and node A1 changes from a high to low state simultaneously, node A4 changes from a high to low state and the output of the first inverter 35 changes node A3 from a low to high state. Then the NMOS transistor Q14 of the first switch 33 turns on and the PMOS transistor Q15 of the second switch 34 turns off.

Furthermore, the output of the second inverter 36 changes node A5 from a high to low state, the PMOS transistor Q13 of the first switch 33 turns on, the NMOS transistor Q16 of the second switch 34 turns off, the PMOS transistor Q9 of the charging/discharging circuit 32 turns on, and the NMOS transistor Q12 turns off. Thereafter, the first switch 33 turns on and the second switch 34 turns off. The voltage of node A2 is transmitted to node A4 through the first switch 33 repeating the above-described circuit operations.

Figure 2:
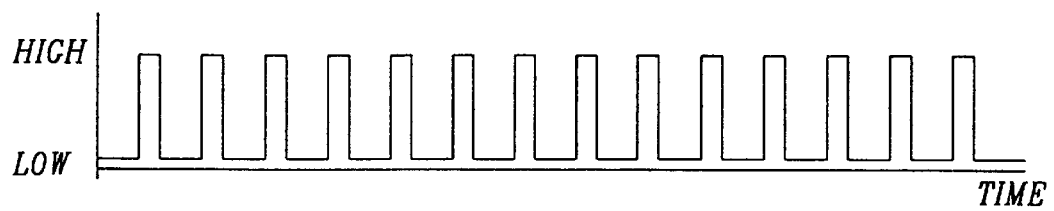
FIG. 2 is a timing diagram of the output signal OUT1 shown in FIG. 1.

The oscillating output signal OUT1 is generated as shown FIG. 2 in accordance with the operation of the charging/discharging circuit 32, the first switch 33, the second switch 34, the first inverter 35, the second inverter 36, and the third inverter 37.

The inverting output circuit 2 generates the output signal OUT2 by inverting the output signal OUT1. The duty cycle of the output signal OUT2 is constant as shown in FIG. 2.

Figure 3:
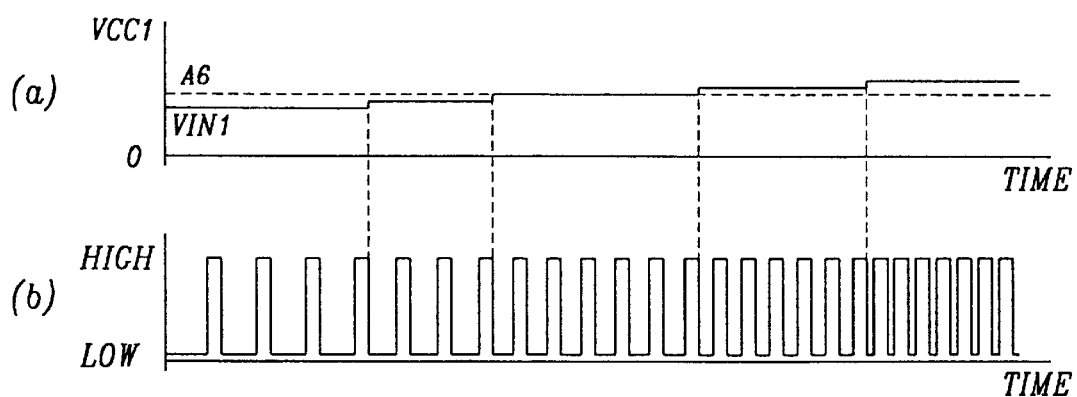
FIG. 3(a) is a timing diagram of the input signal VIN1 and the voltage signal at node A6 for the circuit shown in FIG. 1.
FIG. 3(b) is a timing diagram of the output signal OUT1 for the circuit shown in FIG. 1.

The PMOS transistor Q1 of the frequency adjusting circuit 3 forms a current mirror with the PMOS transistor Q6 causing a current corresponding to the current source IS1 to flow through PMOS transistor Q1. A voltage divider is formed at node A6 between the first resistor R1 and the second resistor R2. The voltage divider formed by the first and second resistor R1 and R2, respectively, generate a reference voltage at node A6 by dividing down the supply voltage VCC1. The reference voltage is provided to the gate of the PMOS transistor. The reference voltage at node A6 is shown in FIG. 3(a). The gate of the PMOS transistor Q3 is provided with the external input voltage VIN1. The external input voltage VIN1 is compared with the reference voltage at node A6. This comparison determines the amount of current flowing through the PMOS transistors Q3 and Q2.

The current flowing through the PMOS transistor Q2 flows through the NMOS transistor Q4. The amount of current flowing through the NMOS transistor Q4 is substantially equal to the current flowing through the NMOS transistor Q5 because NMOS transistor Q5 forms a current mirror with the NMOS transistor Q4. The current is supplied to or from node A1 of the charging/discharging means 32 according to the amount of current flowing through the NMOS transistor Q5. That is, an increase in the external input voltage VIN1 decreases the current flowing through the PMOS transistor Q3 and increases the current flowing through the PMOS transistor Q2. Since the amount of current flowing through both NMOS transistors Q4 and Q5 must be equal, an appropriate amount of current is provided from node A1 of the charging/discharging circuit 32. Therefore, the capacitor C1 charges rapidly and the output signal OUT1 has an increased frequency as shown in FIG. 3(b). Conversely, if the external input voltage VIN1 is lower than the voltage at node A6, the capacitor C1 charges slowly and the output signal OUT1 has a reduced frequency. Thus, if the external input voltage VIN1 is high, the output signal OUT1 has a high frequency. If the external input voltage VIN1 is low, the output signal OUT1 has a low frequency. Users can obtain output signals having a variable frequency by adjusting the external input voltage.

Since the capacitance of the capacitor C2 and the amount of current flowing through the PMOS transistor Q11 and the NMOS transistor Q12 do not change in the first preferred embodiment, the duty cycle of the output signal OUT1 is constant.

Figure 4:
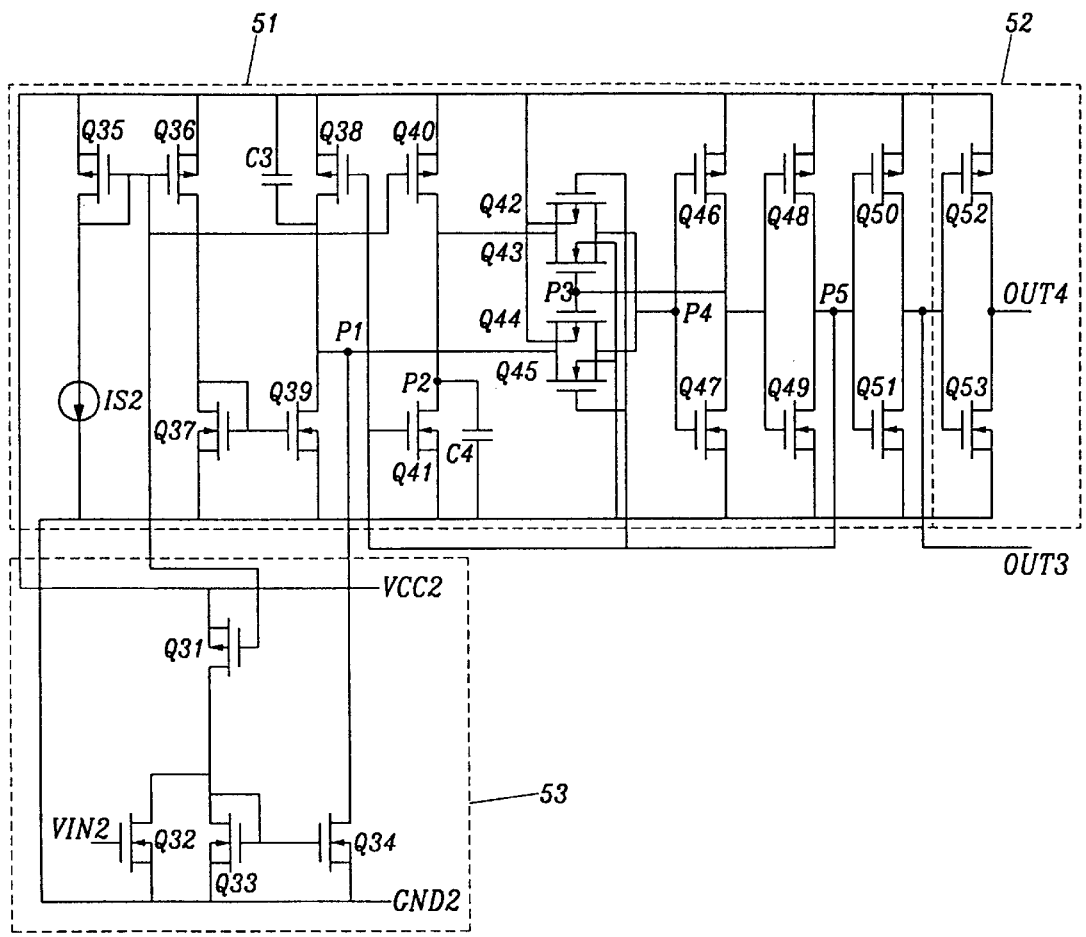
FIG. 4 is a circuit diagram of a ring oscillator having a variable frequency according to a second preferred embodiment of the present invention.

FIG. 4 is a circuit diagram of a ring oscillator having a variable frequency according to the second preferred embodiment of the present invention. Referring to FIG. 4, the ring oscillator of the second preferred embodiment includes the same configuration of an oscillating circuit 51 (oscillating circuit 1 in FIG. 1) and an inverting output circuit 52 (inverting output circuit 2 in FIG. 1) of the first preferred embodiment. However, the second embodiment of the ring oscillator includes a different configuration frequency adjusting circuit 53.

The frequency adjusting circuit 53 includes a PMOS transistor Q31 forming a current mirror with the PMOS transistor Q35 of the current supply means. An NMOS transistor Q32 has a drain connected to a drain of the PMOS transistor Q31, a gate applied with an external voltage VIN2 and a source connected to ground voltage GND2. An NMOS transistor Q33 has a drain and gate connected to the drain of the PMOS transistor Q31 and a source connected to ground voltage GND2. An NMOS transistor Q34 has a drain connected to the drain of the PMOS transistor Q38 of the oscillating circuit 51, a gate connected to the drain of the PMOS transistor Q31, and a source connected to ground voltage GND2.

The second embodiment ring oscillator operates as follows. The oscillating circuit 51 and the inverting output circuit 52 operate in the same manner explained above with reference to the first preferred embodiment. The operation of frequency adjusting circuit 53 is simpler than that of frequency adjusting circuit 3.

Figure 5:
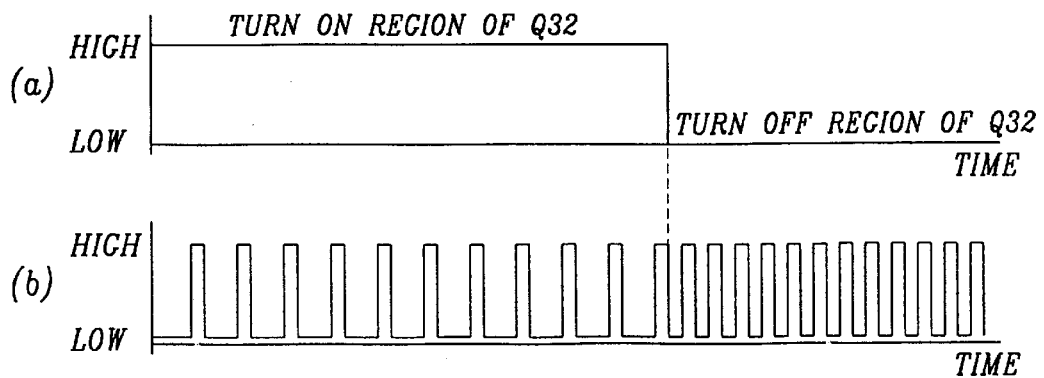
FIGS. 5(a) and 5(b) are timing diagrams of the input signal VIN1 and the output signal OUT1 for the circuit shown in FIG. 4.

Since the PMOS transistor Q31 forms a current mirror with the PMOS transistor Q35, the current flowing through the PMOS transistor Q31 is same as that of current source IS2 of the oscillating circuit 51. A voltage VIN2 is externally input, as shown in FIG. 5(a). If the voltage level of the external input voltage VIN 2 is high, the NMOS transistor Q32 turns on. When this happens, most of the current flows through the NMOS transistor Q32 and a small amount of current flows through the NMOS transistor Q33. The output signal OUT3 is shown in FIG. 5(b). Conversely, if the external input voltage VIN2 is in a low state, the NMOS transistor Q32 turns off. Hence, the current does not flow through the NMOS transistor Q32 and flows through the NMOS transistor Q33.

Since the same amount of current that flows through the NMOS transistor Q33 flows through the NMOS transistor Q34 because of the current mirror formed therebetween, the current is input from node P1 of the oscillating circuit 51. As a result, the charging speed of the capacitor C3 and thus the frequency of output signal OUT3, increases, as shown in FIG. 5(b). The second preferred embodiment of the ring oscillator provides for two frequencies allowing easy implementation in an application circuit.

As described above, the present invention provides a ring oscillator having a variable frequency by adjusting the input voltage so that the ring oscillator can be used in various types of application circuits.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A ring oscillator, comprising:
   an oscillating circuit including a current mirror means coupled to a first and second capacitor, the oscillating circuit being adaptable to generate an oscillating pulse signal, the first and second capacitor being adaptable to vary a duty cycle of the oscillating pulse signal; and
   a frequency adjusting circuit coupled to the oscillating circuit adaptable to vary a frequency of the oscillating pulse signal responsive to an external input voltage, the external input voltage being different than a supply voltage.

2. The ring oscillator of claim 1 wherein the oscillating pulse signal includes a constant duty cycle.

3. The ring oscillator of claim 2 wherein the oscillating circuit comprises:
   a current supply means for supplying a current;
   a charging/discharging means coupled to the current supply means for generating a first and a second node voltages by charging and discharging a first and second capacitors with the current responsive to an internal voltage;
   a switching means coupled to the charging/discharging means for selectively providing either the first or a second node voltage as a switching means output signal responsive to a control signal; and
   an inverting means including a first inverter for inverting the switching means output signal;
   wherein the frequency adjusting circuit varies the frequency of the oscillating pulse signal by adjusting a charge/discharge time of the first capacitor.

4. The ring oscillator of claim 3 wherein the frequency adjusting circuit comprises:
   a reference voltage means for supplying a reference voltage; and
   a voltage comparator for comparing the reference voltage with the external input voltage and adjusting the charge/discharge time of the first capacitor in response thereto.

5. The ring oscillator of claim 4 wherein the current supply means comprises:
   a current source;
   a first PMOS transistor having a drain, a gate, and a source, the drain and the gate being commonly connected to the current source and the source being connected to the supply voltage;
   a second PMOS transistor having a gate, a drain, and a source forming a current mirror with the first PMOS transistor, the gate being connected to the gate of the first PMOS transistor and the source being connected to the supply voltage; and
   a first NMOS transistor having a drain, a gate, and a source, the gate and the drain being commonly connected to a drain of the second PMOS transistor and the source being connected to a ground voltage.

6. The ring oscillator of claim 5 wherein the first transistor forms a current mirror with the first NMOS transistor and the second transistor forms a current mirror with the first PMOS transistor.

7. The ring oscillator of claim 5 wherein the charging/discharging means includes:
   a first and second transistors for generating a bias current corresponding to the current source; and
   a first and second switching transistors connected in series to the first and second transistors, respectively, and in parallel to the first and second capacitors, respectively.

8. The ring oscillator of claim 6 wherein the switching means comprise:
   a first switch including a third PMOS transistor and a second NMOS transistor, the third PMOS transistor being connected in parallel with the second NMOS transistor; and
   a second switch coupled to the first switch including a fourth PMOS transistor and a third NMOS transistor, the fourth PMOS transistor being connected in parallel with the third NMOS transistor.

9. The ring oscillator of claim 8 wherein the inverting means comprises:
   a first inverter including a fifth PMOS transistor and a fourth NMOS transistor for generating the control signal by inverting the switching means output signal;
   a second inverter including a sixth PMOS transistor and a fifth NMOS transistor for generating the internal voltage by inverting control signal; and a third inverter including a seventh PMOS transistor and a sixth NMOS transistor for generating a first output voltage by inverting the internal voltage.

10. The ring oscillator of claim 9 comprising an inverting output circuit for generating the second output voltage by inverting the first output voltage.

11. The ring oscillator of claim 10 wherein the inverting output circuit includes:
   an eighth PMOS transistor having a gate connected to an output terminal of the third inverter and having a source connected to a supply voltage; and
   a seventh NMOS transistor having a gate connected to an output terminal of the third inverter, a drain connected to a drain of the eighth PMOS transistor, and a source connected to the ground voltage.

12. The ring oscillator according to claim 11 wherein the frequency adjusting circuit comprises:
   a first resistor having a first and a second end, the first end being connected to the supply voltage;
   a second resistor having a first and a second end, the first end being connected to the second end of the first resistor and the second end being connected to the ground voltage;
   a ninth PMOS transistor forming a current mirror with the first PMOS transistor;
   a tenth PMOS transistor having a gate, a drain, and a source, the source being connected to a drain of the ninth PMOS transistor and the gate being connected to the first end of the second resistor;
   an eighth NMOS transistor having a gate, a drain, and a source, the drain and gate being commonly connected to the drain of the tenth PMOS transistor and the source being connected to the ground voltage;
   an eleventh PMOS transistor having a gate, a drain, and a source, the drain being connected to a drain of the ninth PMOS transistor and the gate receiving an external input voltage; and
   a ninth NMOS transistor having a gate, a drain, and a source, the drain being connected to a drain of the first switching transistor and to the drain of the eleventh PMOS transistor and the source being connected to the ground voltage, the ninth NMOS transistor forming a current mirror with the eighth NMOS transistor.

13. The ring oscillator according to claim 11 wherein the frequency adjusting circuit comprises:
   a ninth PMOS transistor forming a current mirror with the first PMOS transistor;
   an eighth NMOS transistor having a gate, a drain, and a source, the drain being connected to a drain of the ninth PMOS transistor, the gate receiving an external input voltage, and the source being connected to the ground voltage;
   a ninth NMOS transistor having a gate, a drain, and a source, the drain and gate being commonly connected to the drain of the ninth PMOS transistor and the source being connected to the ground voltage; and
   a tenth NMOS transistor having a gate, a drain, and a source, the drain being connected to a drain of the first switching transistor and forming a current mirror with the ninth NMOS transistor.

14. The ring oscillator of claim 1 wherein increasing the external input voltage increases the frequency of the oscillating pulse signal.

15. A ring oscillator, comprising:
   an oscillator circuit including a current mirror circuit coupled to a first and second capacitor, the oscillator circuit being adaptable to generate an oscillating pulse signal having a duty cycle that is proportional to the first and second capacitor; and
   a frequency adjusting circuit adaptable to vary a frequency of the oscillating signal while maintaining constant a duty cycle of the oscillating signal responsive to an external voltage, the external voltage being different than a supply voltage.

16. The ring oscillator of claim 15 including and an inverting circuit for inverting the oscillating pulse signal.

17. The ring oscillator of claim 16 wherein the inverting circuit includes a PMOS transistor connected in series with an NMOS transistor.

18. The ring oscillator of claim 15 wherein the oscillator circuit includes:
   a current supply circuit for supplying a current;
   a charge/discharge circuit coupled to the current supply circuit for generating a first and a second node voltages by charging and discharging a first and second capacitors with the current;
   a first switch circuit for generating a first internal voltage signal by selectively providing the first and a second node voltages responsive to a second internal voltage signal;
   a first inverter circuit for generating the second internal voltage signal by inverting the first internal voltage signal;
   a second inverter circuit for generating a third internal voltage signal by inverting the second internal voltage signal; and
   a third inverter circuit for generating a first output voltage signal by inverting the third internal voltage signal.

19. The ring oscillator of claim 18 wherein the frequency adjusting circuit includes:
   a voltage divider for generating a reference voltage from the voltage supply;
   a differential amplifier for comparing the reference voltage to the external voltage; and
   a current mirror coupled to the differential amplifier.

20. The ring oscillator of claim 18 wherein the frequency adjusting circuit includes:
   a current mirror having a first and a second NMOS transistor;
   a third NMOS transistor connected in parallel to the first NMOS transistor; and
   a first PMOS transistor coupled to the first NMOS transistor.

21. The ring oscillator of claim 15 wherein the frequency adjust circuit is adaptable to increase the frequency of the oscillating pulse signal as the external voltage is increased.

* * * * *